United States Patent
Sopori

[19]

[11] Patent Number: 5,897,331
[45] Date of Patent: Apr. 27, 1999

[54] HIGH EFFICIENCY LOW COST THIN FILM SILICON SOLAR CELL DESIGN AND METHOD FOR MAKING

[75] Inventor: Bhushan L. Sopori, Denver, Colo.

[73] Assignee: Midwest Research Institute, Kansas City, Mo.

[21] Appl. No.: 08/745,951

[22] Filed: Nov. 8, 1996

[51] Int. Cl.⁶ .................... H01L 21/00; E03B 11/00; F17D 1/00
[52] U.S. Cl. .............................. 438/90; 136/258
[58] Field of Search ............. 438/90, 96; 136/258

[56] References Cited

U.S. PATENT DOCUMENTS

| | | | |
|---|---|---|---|
| 2,802,759 | 8/1957 | Moles | 148/1.5 |
| 4,180,618 | 12/1979 | Alpha et al. | 482/428 |
| 4,321,104 | 3/1982 | Hasegawa et al. | 156/643 |
| 4,335,362 | 6/1982 | Salathe et al. | 372/46 |
| 4,359,486 | 11/1982 | Patalong et al. | 427/53.1 |
| 4,525,221 | 6/1985 | Wu | 148/1.5 |
| 4,566,177 | 1/1986 | Van de Ven et al. | 29/590 |
| 4,781,766 | 11/1988 | Barnett et al. | 136/258 |
| 5,166,095 | 11/1992 | Hwang | 437/188 |
| 5,175,125 | 12/1992 | Wong | 437/188 |
| 5,223,453 | 6/1993 | Sopori | 437/173 |
| 5,358,574 | 10/1994 | Sopori | 136/249 |
| 5,429,985 | 7/1995 | Sopori | 437/173 |
| 5,431,741 | 7/1995 | Sakaguchi et al. | 136/244 |

FOREIGN PATENT DOCUMENTS

| | | |
|---|---|---|
| 204 350 | 11/1983 | Germany . |
| 52-63068 | 5/1977 | Japan . |
| 58-56405 | 4/1983 | Japan . |
| 59-214224 | 12/1984 | Japan . |
| 60-783 | 1/1985 | Japan . |
| 61-220416 | 9/1986 | Japan . |
| 2-77121 | 3/1990 | Japan . |

Primary Examiner—Brian Dutton
Attorney, Agent, or Firm—Ken Richardson

[57] ABSTRACT

A semiconductor device having a substrate, a conductive intermediate layer deposited onto said substrate, wherein the intermediate layer serves as a back electrode, an optical reflector, and an interface for impurity gettering, and a semiconductor layer deposited onto said intermediate layer, wherein the semiconductor layer has a grain size at least as large as the layer thickness, and preferably about ten times the layer thickness. The device is formed by depositing a metal layer on a substrate, depositing a semiconductive material on the metal-coated substrate to produce a composite structure, and then optically processing the composite structure by illuminating it with infrared electromagnetic radiation according to a unique time-energy profile that first produces pits in the backside surface of the semiconductor material, then produces a thin, highly reflective, low resistivity alloy layer over the entire area of the interface between the semiconductor material and the metal layer, and finally produces a grain-enhanced semiconductor layer. The time-energy profile includes increasing the energy to a first energy level to initiate pit formation and create the desired pit size and density, then ramping up to a second energy level in which the entire device is heated to produce an interfacial melt, and finally reducing the energy to a third energy level and holding for a period of time to allow enhancement in the grain size of the semiconductor layer.

32 Claims, 7 Drawing Sheets

HIGH EFFICIENCY LOW COST THIN FILM SILICON SOLAR CELL DESIGN AND METHOD FOR MAKING

CONTRACTUAL ORIGIN OF THE INVENTION

The United States Government has rights in this invention under Contract No. DE-AC0283CH10093 between the U.S. Department of Energy and the National Renewable Energy Laboratory, a Division of Midwest Research Institute.

BACKGROUND OF THE INVENTION

1. Field of the Invention

The present invention relates generally to the fabrication of semiconductor devices and more particularly to a method of fabricating highly efficient, thin film semiconductor devices using a low quality substrate and low temperature, optical processing.

2. Description of the Prior Art

Thin film semiconductor devices, used extensively in a myriad of microelectronic and opto-electronic devices, have generated considerable academic and commercial interest in recent years. In particular, these "thin" film devices (i.e., solar cells), wherein the film thickness is less than the optical absorption depth, can exhibit high solar energy to electrical energy conversion efficiencies as compared to their "thick" film counterparts.

Optimal conversion efficiency for thin film silicon solar cells is generally thought to require a grain size of several hundred microns, preferably about ten times the film thickness, and a minority carrier diffusion length of about 50 to 100 $\mu$m, or approximately twice the film thickness. In addition, to realize optimal efficiency, thin film solar cells must exhibit a variety of desirable optical and electronic properties. Such additional properties include low electrical resistivity, high optical reflectance, high optical confinement at the contact-semiconductor interface, and minimal absorption loss at the metal contact layer. Assuming the presence of all of these attributes, the theoretical efficiency limit for a single-junction, thin film multi-crystalline silicon solar cell is about 16% to 18%.

As interest in these thin film semiconductor devices intensifies, so too does the need for more efficient and economical designs. Unfortunately, simultaneous improvement in these areas, performance and cost, has been difficult due to a number of structural and functional limitations in semiconductor device fabrication. For example, most conventional semiconductor devices include costly, crystalline substrates which function as both the substrate for subsequent depositions as well as the semiconductor material itself. To make less expensive semiconductor devices requires the use of less costly, non-crystalline substrates. Unfortunately, most low-quality substrates (e.g., amorphous glass) cannot withstand the high processing temperatures required to produce a high efficiency film using conventional techniques. One conventional process for making silicon solar cells, for example, requires a thermal furnace with temperatures in excess of 850° C. (the melting point of silicon is 1430° C.). Such high processing temperatures place severe limitations on the choice of substrate (glass, for example, softens at about 500° C.). In addition to their thermal lability, low-quality substrates typically include impurities which diffuse into the semiconductor material at high processing temperatures, thereby reducing the performance of the semiconductor or even rendering the device inoperative.

One way around the temperature limitation described above is to add a metal dopant, such as tin or copper, to the semiconductor material to depress the melting point, thereby facilitating deposition of the semiconductor at lower temperatures. This technique can work reasonably well for epitaxial growth on conventional crystalline substrates, such as single or multi-crystalline silicon. However, epitaxial growth of semiconductor materials directly on crystalline substrates (without a barrier layer) results in optical continuity (i.e., negligible index of refraction change) at the film-substrate interface. Unfortunately, optical continuity at the film-substrate interface reduces photovoltaic efficiency by enabling incident electromagnetic radiation to pass through the device, rather than being absorbed by the semiconductor material to produce electricity. Deposition of a metal-doped semiconductor on a non-crystalline or lattice mismatched substrate, on the other hand, can cause a number of problems including the formation of a very fine-grain semiconductor film, incorporation of residual metal at grain boundaries, and diffusion of metal at the interfaces. It is important that the semiconductor film have a relatively large grain structure to minimize the number of grain boundaries, or minority carrier recombination sites, which function as shunts to reduce flow of generated carriers between the semiconductor device and the external electronic circuit. Thus, although certain metals can effectively lower the melting point of the semiconductor material, which in turn reduces the deposition temperature and expands the choice of acceptable substrates, such techniques produce inefficient semiconductor devices, either because of optical continuity at the film-substrate interface or large carrier recombination losses at grain boundaries.

As previously mentioned, a grain size of several hundred microns is required for optimal conversion efficiency of thin film silicon solar cells. Unfortunately, conventional techniques can produce only small-grain silicon films at low processing temperatures. To effectively enlarge the grain size of this material, and thus reduce the number of grain boundaries or recombination sites, the film must be remelted and directionally solidified (i.e., re-solidified to position the grains in a columnar orientation) or annealed for very long durations. However, this grain-enhancement process requires extensive thermal heating which, as discussed above, prevents the use of most low-quality substrates.

Other electronic and optical properties affecting the performance of a photovoltaic semiconductor device include the device's optical confinement capacity, resistance due to electrical contacts, and optical reflectance. Forming thin, conductive metal layers on semiconductor materials is an essential step in the manufacture of microelectronic and opto-electronic devices to provide electrical contacts or current carrying paths to and from the semiconductor substance. During manufacture, such thin metal layers, or contacts, are applied to the semiconductor substance by any one of several well-known deposition techniques such as vapor deposition, sputtering, or electrolytic precipitation.

It is desirable to create an interface between the semiconductor material and the metal contact layer that has both low resistivity and high optical reflectance. Low resistivity is a primary requirement of any contact on a semiconductor device to reduce the barrier to carrier flow between the semiconductor device and the external electronic circuit. It is important, therefore, that the electrical contact be ohmic, even at very high current densities. Newer high efficiency solar cell designs utilize optical confinement techniques to capture and manage incident electromagnetic radiation so that more of it is absorbed in the semiconductor to produce electricity instead of escaping or being absorbed at the contact-substrate interface and dissipated as heat. Optical confinement is facilitated by highly reflecting interfaces where the contact joins the semiconductor material to prevent escape or absorption of the electromagnetic radiation at that interface and reflecting it instead back into the semiconductor for production of electricity. High optical reflectivity, therefore, is important to increase the amount of electromagnetic radiation energy absorbed by the semiconductor material, thereby improving the operation of the semiconductor device by increasing the number of photo-generated electrons available for collection. Unfortunately, it is difficult to provide both of these conditions simultaneously, low resistivity and high optical reflectance, at the semiconductor-metal interface using conventional methods. High optical reflectance requires a clean, abrupt semiconductor-metal interface, which is difficult to achieve. When a metal layer is deposited on a semiconductor, the contact is not electrically intimate, i.e., there is generally a layer of oxide which must be broken down by sintering or alloying. Conventional thermal processing produces a graded semiconductor-metal interface, which can provide a low-resistivity ohmic contact but does not provide high optical reflection, since the incident electromagnetic radiation at the interface can propagate into and through the graded interface to the metal and be totally absorbed and dissipated as heat.

While deposition techniques bond the metal layers to the semiconductor substance, the bond formed by such deposition techniques is usually not sufficient, either mechanically or electrically, to yield reliable, and sometimes even functional, devices. Consequently, the semiconductor must be processed further to improve the bonds between the conductive metal layer and the semiconductor material, for example, by either alloying or sintering the metal layers to the semiconductor surface, both of which involve additional high processing temperatures.

Sintering and alloying are two different processes that are used in semiconductor fabrication and which result in different electrical and mechanical characteristics, such as contact resistance, ohmicity, and bonding. Alloying generally creates a better bond and electrical contact with the semiconductor material because the metal layer and semiconductor material actually melt and meld together. Where semiconductor junctions or other thin film layers are close to the surface, however, such melting for alloying can disrupt or destroy the semiconductor structure or functions. Thus, a slightly lower temperature to produce sintering, which merely breaks down the interface oxide and remains more localized at the interface surfaces, may be more appropriate than alloying in those situations. Also, where there is heavy doping of the silicon, such as near a $p^+$-n or $n^+$-p junction, electrical contact between the doped silicon and the metal contact is easier to establish. Consequently, sintering, rather than alloying is usually sufficient. Therefore, it has become a general practice in the industry, particularly for solar cells and other opto-electronic devices, to alloy bottom metal contact layers to the bottoms of semiconductor substrates, while the top contacts, which are usually thin strips or grids near the junction, are only sintered to the heavily doped top surface of the semiconductor material.

In one conventional type of alloying process, metallized semiconductors, i.e., semiconductor substrates with metal contacts deposited thereon, are heated in an alloying furnace to a sufficiently high temperature to melt both the metal and the immediately adjacent substrate material, thereby improving the bond between the two materials and producing the desired electrical and mechanical characteristics. Such furnace alloying is frequently performed at temperatures in excess of 400° C. and for as long as thirty minutes. Exposing the metallized semiconductor to such temperatures in a furnace over such an extended time heats up the entire semiconductor structure uniformly and creates an isothermal condition within the semiconductor. Unfortunately, such heating deep into the semiconductor material prevents the use of most low-quality substrates and, even with high-melting point materials, tends to degrade the semiconductor and reduce its performance.

Another problem with the furnace alloying process is that the atmosphere around the metallized semiconductor and the entire furnace are heated along with the individual metal layers or contacts and the semiconductor substrate. Not only does this heating of the atmosphere around the semiconductor waste energy, it also encourages degradation of the electrical characteristics of the metal layers due to atmospheric impurities. One form of this degradation is oxidation, which significantly degrades the electrical characteristics of the metal layer. It is well-known that even small traces of oxygen in the atmosphere surrounding the metallized semiconductor can oxidize the metal layer. Consequently, most furnace alloying processes require that the process be performed in a vacuum, or they require the use of a highly purified inert atmosphere, such as argon or helium, to reduce oxidation of the metal layer. Obviously, the creation of such special, purified environments is expensive.

Another, more popular alloying technique, commonly referred to as optical processing or rapid thermal alloying (RTA), bombards the metallic depositions on the semiconductor from the solid metal bottom side or from all sides, for a few seconds with pulsed, high intensity visible and infrared light, such as light produced by a high intensity CW visual light lamp. This pulsing of the metallized semiconductor with electromagnetic radiation results in a rapid increase in the temperature of the metal layer and the semiconductor substrate, thereby alloying the metal with the semiconductor substrate. U.S. Pat. No. 4,335,362 to Salathe et al., describes a slight variation of this RTA technique wherein narrow regions of the metallic layers are alloyed with the semiconductor by heating the regions with a focused beam from a Nd:YAG (four-level infrared) laser. Other examples of these techniques can be found in U.S. Pat. No. 4,359,486 to Patalong et al., U.S. Pat. No. 4,525,221 to Wu, and U.S. Pat. No. 4,566,177 to van de Ven et al.

Unfortunately, however, RTA suffers some of the same drawbacks as the furnace alloying process. For example, the RTA process usually illuminates a semiconductor device from both the top and bottom sides, the bottom side typically being the solid metal base or contact. Because the metal deposited on the bottom side is reflective, the outside surface of the bottom metal layer reflects a substantial portion of the incoming electromagnetic radiation back to the surrounding atmosphere, heating both the atmosphere and the outer surface of the metal. Of course, heating the outside surface of the metal enough to alloy the inside surface of the metal to the semiconductor material only exacerbates the contamination and oxidation problems described previously. Accordingly, the RTA process must also be performed under vacuum or in an inert environment. Even with such special inert environments, oxidation is still so prevalent in RTA that it is common to redeposit a metal layer over the alloyed metal in an attempt to re-gain the electrical integrity of the oxidized metal.

As discussed previously, "thin" film photovoltaic devices can exhibit high solar energy to electrical energy conversion efficiencies due to reduced minority carrier recombination in the bulk. It is important to minimize the minority carrier recombination sites in the semiconductor film, since recombination reduces the carrier flow between the semiconductor device and the external electronic circuit. In other words, fewer recombination sites provides an increased open-circuit voltage and fill factor, i.e., a higher quality and more efficient photovoltaic cell. Thus, because of their reduced volume, thin semiconductor films comprise relatively few recombination sites, and hence offer higher efficiencies, than thick films. Unfortunately, this reduced film thickness also means less absorption of optical photons. Thus, an important consideration in the fabrication of high efficiency thin films is to include some type of optical confinement technique to effectively increase the optical path length and hence absorption. Most existing techniques involve texturing surfaces of semiconductor devices, including masked chemical etching, unmasked chemical etching, and laser and mechanical grooving. Front surface etching has been used to reduce surface reflectance and to scatter incoming, normally incident light at oblique angles within the device. However, a disadvantage of front side texturing is that it causes an increased dark current, hence a lower open circuit voltage and fill factor. Also, texturing on the junction side of a semiconductor device, which is usually, but not necessarily always, on the front side, with previously used techniques can result in textured peaks that break the junction and cause shunting, which can seriously damage or destroy the device. Therefore, backside texturing is preferred over front side texturing, if other antireflective measures such as antireflective coatings are used on the front surface. Because light trapping is needed only for light that reaches the backside, i.e., less absorbing light, backside texturing can be quite effective.

Backside texturing, however, also has had its problems, one of the most significant of which is that the backside is usually used for the metal electrical contact. Conventional methods for producing backside texture without front texture involve chemical etching or otherwise texturing the back surface prior to deposition of the metal contact layer, which requires masking the front surface to avoid damage during the backside etching process. The device then has to be thoroughly cleaned before deposition of the metal contact layer. Also, the initial semiconductor-metal interface, while bonded in the deposition process, still has a high resistivity that must be lowered substantially, either by alloying or sintering, to be useful as an electric contact for the photovoltaic device. However, conventional alloying, even with the newer rapid thermal alloying (RTA) techniques, is difficult to control and tends to create a deep, graded alloy layer at the semiconductor-contact interface that absorbs light and dissipates the energy as heat, instead of reflecting the light back into the semiconductor material where it can be absorbed and converted to electricity.

Another problem commonly associated with the fabrication of thin film semiconductor devices is the high absorption loss at the metal contact layer as a result of the thin semiconductor film. Because the thickness of the semiconductor material in thin film devices is much less than the absorption length of incident electromagnetic radiation (i.e., complete absorption of long wavelength radiation requires a film thickness of several hundred microns), multiple passages through the semiconductor layer are required to effectively increase the optical path length and hence absorption of incident radiation by the semiconductor. Unfortunately, multiple passages require multiple reflections at the semiconductor-metal interface, which typically increases the optical absorption by the metal contact layer, resulting in the dissipation of energy as heat. Thus, although thin film devices can theoretically provide high photovoltaic conversion efficiencies because of the reduced minority carrier recombination in the bulk, devices based on conventional designs typically suffer from high absorption loss at the contact layer.

Given the number and variety of constraints in semiconductor device fabrication, it is not surprising that simultaneous improvement in device performance and cost is difficult to achieve. To make less expensive devices requires the use of low-quality semiconductor substrates which, unfortunately, cannot withstand the high processing temperatures used in conventional fabrication methods. Moreover, low-quality substrates typically include impurities which can diffuse into the semiconductor material at high processing temperatures, thereby reducing the performance of the semiconductor. Also, for optimal device performance, the design must provide light trapping and immunity to impurity diffusion.

Recognizing the need to reduce deposition temperatures, several researchers have used metal dopants to depress the melting point, thereby facilitating deposition of the semiconductor at a lower temperature, followed by thermal processing in an attempt to enhance the grain size. However, as discussed previously, this technique produces inefficient semiconductor devices, either due to optical continuity at the film-substrate interface or large carrier recombination losses at grain boundaries. Such methods are also expensive, with costly substrates and generally high production costs. Other researchers have investigated the use of ceramic materials as substrates, the composition and effectiveness of which are not known.

One researcher has attempted to reduce production costs by proposing a multi-junction semiconductor device using a glass substrate. Although this design features a thin semiconductor film and should provide high photovoltaic efficiency, it unfortunately suffers some of the same drawbacks as conventional fabrication methods. For example, formation of the junctions in this device may involve high processing temperatures, which can soften the substrate and allow diffusion of impurities from the substrate into the semiconductor material. Moreover, although this process incorporates a low-cost substrate, the overall production costs for this device remain high due to the expense associated with multi-layer depositions.

A need therefore exists for an improved fabrication process to produce high efficiency, low-cost semiconductor devices using low quality substrates and low processing temperatures. This high efficiency semiconductor should feature a variety of desirable optical, electronic and mechanical properties, including large grain size, low electrical resistivity, high optical reflectance, high optical confinement (or optical discontinuity) at the contact-semiconductor interface, minimal absorption loss at the metal contact layer, and an impurity barrier and gettering medium at the contact-semiconductor interface to prevent diffusion of impurities from the substrate into the semiconductor. Ideally, this high efficiency device should have a semiconductor film with a minority carrier diffusion length of about twice the film thickness, and a grain size of about ten times the film thickness. Until this invention, no such process or device existed.

SUMMARY OF THE INVENTION

Accordingly, it is a general object of this invention to provide a high efficiency, thin film semiconductor device and a method for making such a device using a low quality, non-crystalline substrate and a low processing temperature.

It is a more specific object of this invention to provide a method of making a semiconductor device using a low processing temperature such that the substrate is not affected and diffusion of impurities from the substrate into the semiconductor material does not occur.

It is another object of this invention to provide a method of making a semiconductor device having a semiconductor layer with a large-grain base region.

It is a more specific object of this invention to provide a method of making a semiconductor device having a grain size of about ten times the thickness of the semiconductor layer.

It is another specific object of this invention to provide a method of making a semiconductor device having a minority carrier diffusion length of approximately twice the thickness of the semiconductor layer.

It is a further object of this invention to provide a method of making a semiconductor device such that the semiconductor layer is thin and yet the device has high optical confinement.

It is another specific object of this invention to provide a method of making a semiconductor device having a semiconductor layer which is textured on one or both interfaces.

It is a further specific object of this invention to provide a method of making a semiconductor device having an electrical contact layer on a semiconductor material such that the contact-semiconductor interface has both low electrical resistivity and high optical reflectivity.

It is yet a further specific object of this invention to provide a method of making a semiconductor device having an impurity barrier and a "sink" for impurities at the contact-substrate interface to prevent the diffusion of impurities from the substrate into the semiconductor material.

Finally, it is another general object of this invention to provide a high efficiency, low-cost semiconductor device having all of the above attributes.

To achieve the foregoing and other objects and in accordance with the purposes of the present invention, as embodied and broadly described therein, the method of this invention includes enhancing the grain size of a metallized semiconductor material, while simultaneously back surface texturing and alloying the metallized semiconductor using a unique form of optical processing. This unique optical processing method involves illuminating the front side of the semiconductor material with electromagnetic radiation from the top surface according to a predetermined time schedule of energy levels, and with an electromagnetic spectrum that is tuned to provide sufficient optical energy to texture the back surface of the semiconductor device, alloy the metal layer to the semiconductor material, and then enhance the grain size of the semiconductor material. The illuminating radiation, typically rich in the infrared region depending on the materials being used, is substantially transmitted through the semiconductor material to the interface between the top surface of the metal and the bottom surface of the semiconductor material. This normally incident radiation at this interface provides sufficient optical energy to produce isolated, spaced-apart diffusion pits and spikes in the semiconductor material surface, and also produces an increase in temperature sufficient to alloy the pits and spikes along with a thin layer of the metal with the semiconductor material over the entire semiconductor-metal interface area. Following texturing and alloying, the energy level of incident radiation is reduced to provide optical energy levels sufficient to cause displacement of the grain boundaries in the crystalline semiconductor material, thus enlarging the grain size therein. In an alternate preferred embodiment, this grain-enhanced material may serve as a seed layer for epitaxial growth during a subsequent deposition of semiconductor material, wherein the subsequent deposition may involve the same or a different semiconductor material.

To further achieve the foregoing and other objects and in accordance with the purposes of the present invention, as embodied and broadly described therein, the articles of manufacture of this invention may comprise a non-crystalline substrate, a conductive intermediate layer deposited onto said substrate, wherein the intermediate layer serves as a back electrode, an optical reflector, and an interface for impurity gettering, and a semiconductor layer deposited onto said intermediate layer, wherein the semiconductor layer has a large-grain base region, preferably having a grain size at least as large as the thickness of the semiconductor layer, and more preferably about ten times the thickness.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention.

In the Drawings.

DETAILED DESCRIPTION OF THE PREFERRED EMBODIMENTS

Figure 1:
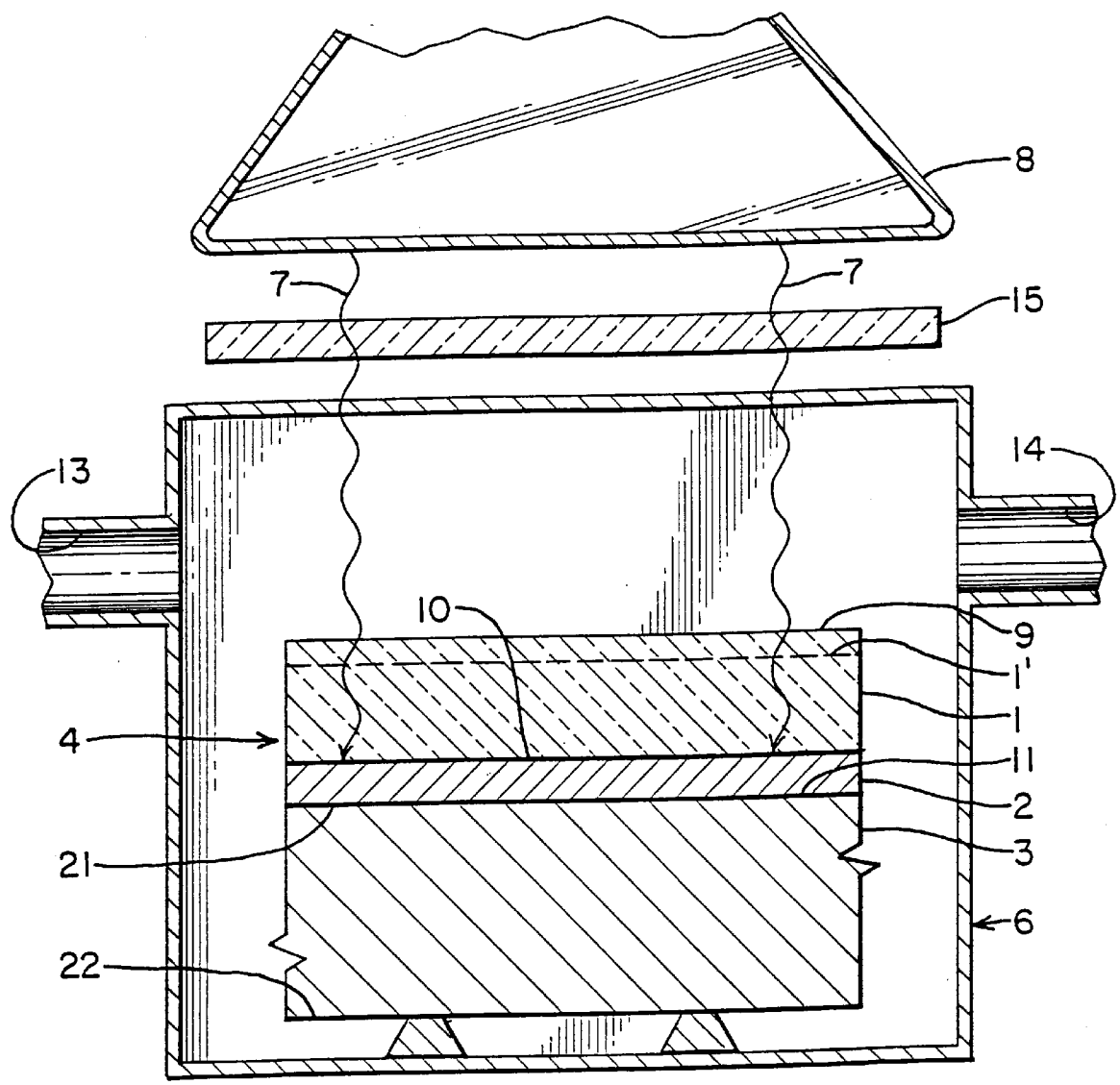
FIG. 1 is a cross-sectional view (not in actual scale or proportion) of a semiconductor device, such as a solar cell, that is being grain-enhanced, alloyed, and back-surface textured within a schematically drawn quartz chamber according to this invention.
Figure 6:
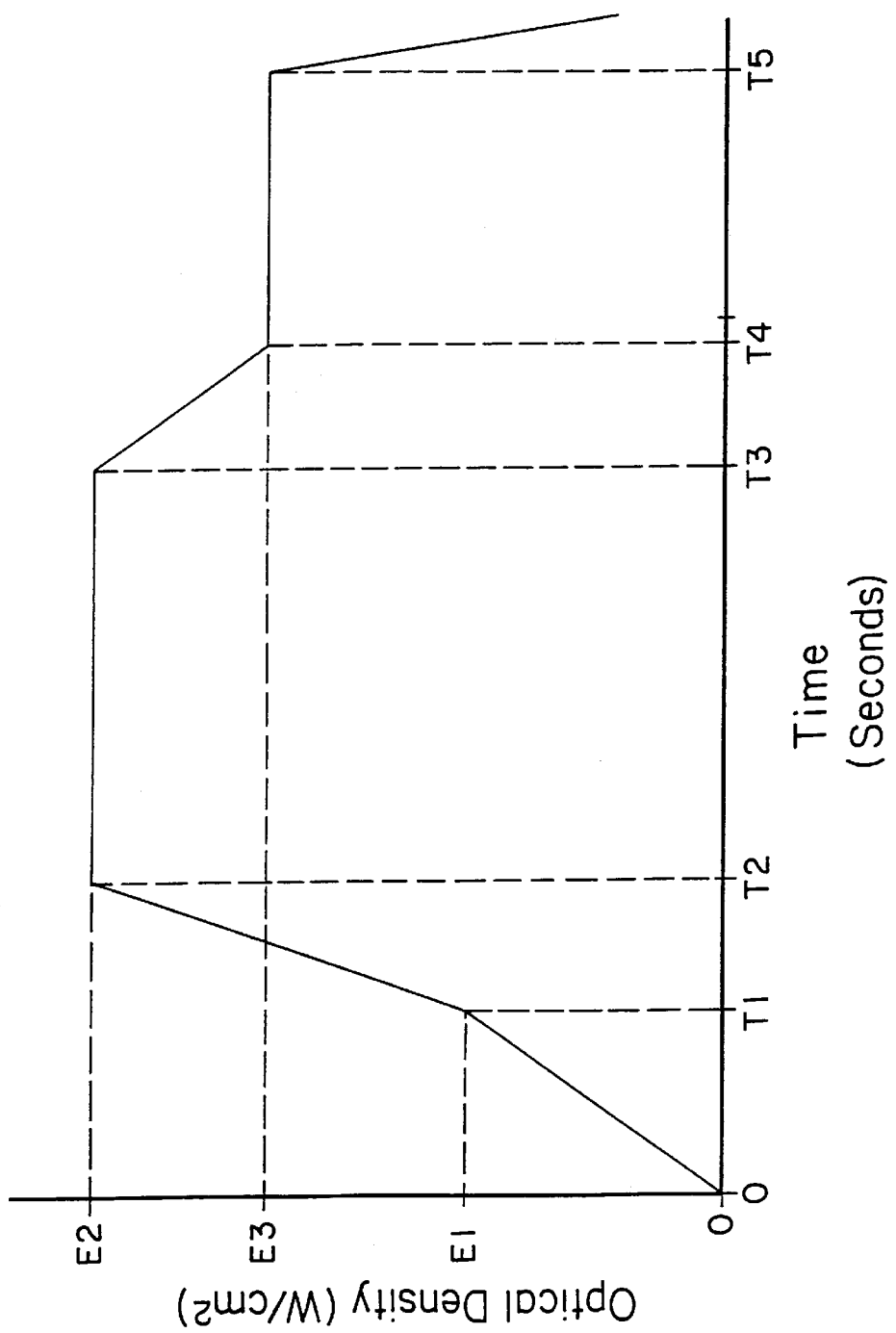
FIG. 6 is a graph of the energy levels versus time of the incident electromagnetic radiation for the preferred embodiment of the invention.

An appropriate process set up for practicing the one-sided infrared light illumination method for enhancing the grain size of a semiconductor material 1, while simultaneously texturing the bottom or backside surface 10 of the semiconductor material 1 and alloying the backside surface 10 with a metal contact layer 2 according to the present invention is illustrated in FIG. 1. A semiconductor device 4 comprising a semiconductor material 1 doped and fabricated with a p-n junction 1' adjacent its front side or first surface 9, a metal electrical contact 2, and a substrate 3 is shown positioned in a quartz muffle 6. The quartz muffle is transparent, so the semiconductor device 4 can be illuminated with electromagnetic radiation 7 from an electromagnetic radiation source 8. A predetermined wavelength, or combination of wavelengths preferably comprising infrared radiation, is directed onto the front side 9 according to an incident energy-time schedule or profile as illustrated in FIG. 6, which will be described in more detail below. The electromagnetic radiation source 8 is designed preferably to illuminate the front side 9 of the semiconductor material 1 in a substantially uniform manner over substantially the entire surface area of front side 9 for best results. The radiation 7, as mentioned above, is preferred to be primarily, if not exclusively, in the infrared range to provide optical energy and heat in a unique manner to produce grain enhancement, alloying and texturing according to this invention, as will be described in more detail below. Therefore, an optical filter 15 can be provided to filter out other extraneous wavelengths that might be produced by the source 8. In the event a particular application or combination of materials makes it desirable to include some additional wavelength radiation, such as visible or ultraviolet, the filter 15 could be chosen to also pass such desired additional wavelengths.

The illustrations of semiconductor device 4 and its various portions or components in FIGS. 1 through 5 are not intended to be drawn to scale or even in proportion, because the very thin components and layers of the semiconductor device 4 are impractical, if not impossible, to illustrate to scale or in proper proportion. Therefore, those figures are for illustrative purposes only, as will be understood by persons skilled in this art.

The semiconductor material 1 of the semiconductor device 4 is largely transparent to the infrared electromagnetic radiation 7 emitted from the electromagnetic radiation source 8. Therefore, most of the infrared electromagnetic radiation 7 incident on the front side 9 is transmitted to the backside or second surface 10 of the semiconductor material 1, as illustrated generally in FIG. 1, where it is absorbed by the metal contact layer 2 or in the semiconductor-metal interface at backside surface 10 and converted to heat. The presence of photons and heat generated at the semiconductor-metal interface 10 first causes pit formation and diffusion at diverse, isolated locations to texture the backside surface 10 and then alloys metal from metal layer 2 with the semiconductor material 1 at the interface 10, as will be described in more detail below. Although the mechanism of grain enhancement is not fully understood, it is believed that the infrared electromagnetic radiation 7 and/or heat generated at backside surface 10 during texturing and alloying also causes point defects, possibly atomic vacancies, in the semiconductor material 1 near the semiconductor-metal interface 10. These point defects then spread through the semiconductor material 1 where they cause a non-conservative movement in the grain boundaries, thereby enhancing the grain size of the semiconductor material 1, by a mechanism that will be explained in more detail below. For purposes of this description, the backside or second surface and the interface of the semiconductor material 1 with the metal layer 2 are designated with the same reference number 10 for purposes of clarity, because they are both at essentially the same location or feature of the semiconductor device 4.

This method of enhancing the grain size of a semiconductor material 1, while simultaneously texturing and alloying the backside surface 10 of the semiconductor material 1 with a metal contact layer 2, according to this invention, without illuminating the back surface 11 of metal 2 is referred to in this specification as one-sided infrared light illumination, because the illumination is from just one side of the device 4, usually the top surface 9, as opposed to conventional optical alloying which directs electromagnetic radiation from at least the bottom or metal side, if not from all directions, and because the back surface 11 of the metal 2 is not illuminated externally at all. The one-sided infrared light illumination method of the instant invention is a modification of the methods taught by the present inventor in U.S. Pat. No. 5,429,985, entitled "Fabrication of Optically Reflecting Ohmic Contacts for Semiconductor Devices," and U.S. Pat. No. 5,358,574, entitled "Dry Texturing of Solar Cells," both incorporated by reference herein.

The fabrication of a semiconductor device 4 usually begins with substrate 3 (e.g., glass) having a top surface 21 and a bottom surface 22. The semiconductor substrate can include both p-type and n-type semiconductor material to form a p-n junction 1', which is illustrated in FIG. 1 adjacent the top surface 9. A junction adjacent the bottom surface 10 is possible, but not preferably, because the pit and spike formation at the interface 10 could protrude into the junction and short circuit it, thus seriously damaging or "killing" the semiconductor as an electricity producing device. The metal layer 2 is usually deposited on the top surface 21 of the substrate 3 to function as an electrical contact for the device 4. The metal layer 2, which may either partially or completely cover the substrate 3, also functions as an optical reflector, an impurity barrier and a gettering medium to prevent the diffusion of impurities from the substrate 3 into the semiconductor material 1, and provides a mechanism for grain enhancement, as will be described in more detail below. Following deposition of the metal layer 2, a semiconductor material 1 is usually deposited on the top surface 10 of the metal layer 2 to function as a semiconductor for the device 4. For the purpose of providing a detailed description and an enabling embodiment, but not for the purpose of limitation, this description refers to a glass substrate 3, a thin layer 2 of aluminum deposited on its top surface 21, and a silicon semiconductor material 1 deposited on the top surface 10 of the aluminum-coated glass substrate. The method of this invention, however, can be used on many metallized semiconductors, and the present invention should not be regarded as limited to the specific glass, silicon and aluminum-metallized semiconductors shown and described herein.

A semiconductor device 4 comprising a glass substrate 3 with an aluminum layer 2 deposited on its top surface 21 (and optionally including a thin layer of chromium deposited on the glass substrate 3 between the top surface 21 and the aluminum layer 2) and a silicon semiconductor material 1 deposited on the top surface 10 of the aluminum layer 2 is processed, according to this invention, by illuminating the top surface 9 of the semiconductor device 4 with optical energy of a predetermined energy level, duration, and wavelength according to the timing schedule or energy-time profile illustrated in FIG. 6, as will be described below. The electromagnetic radiation source 8 shown in FIG. 1, such as a tungsten-halogen lamp, illuminates the semiconductor device 4 with infrared-rich electromagnetic radiation 7, i.e., electromagnetic radiation having significant power in the wavelengths of about 700 nanometers or longer, so that the electromagnetic radiation 7 is incident substantially normal to the semiconductor device 4. The incident infrared electromagnetic radiation 7 is mostly transmitted through the silicon semiconductor material 1 to the aluminum layer 2 deposited on the top surface 21 of the glass substrate 3. Therefore, there is little or no absorption of the infrared radiation in the semiconductor material, thus little or no extraneous heating of the silicon material 1 from the infrared portion of the incident electromagnetic radiation 7. Instead, the transmitted infrared electromagnetic radiation 7 is partially absorbed by the aluminum layer 2 or at the interface 10. The presence of photons at the interface enhances diffusion of silicon into aluminum. However, because it is activated at low energies, the diffusion does not occur uniformly, thus resulting in isolated nucleation sites or "hot" spots. The transmitted infrared electromagnetic radiation 7 also produces a sufficient increase in temperature in the semiconductor device 4 to form "pits" and "spikes" and to melt and alloy the aluminum to the bottom surface 10 of the silicon material 1, as described in more detail below. This process creates a textured Si—Al alloy layer 5 (shown in FIGS. 4 and 5) at the interface 10 between the silicon material 1 and the aluminum layer 2, as will also be described in more detail below. Although the mechanism of grain growth is not yet fully understood, and not wishing to be bound by any specific theory, it is believed that the incident infrared electromagnetic radiation 7 and/or heat generated at the metal-semiconductor interface 10 during texturing and alloying also creates point defects or vacancies in the silicon material 1 at the interface 10, which in turn facilitate enhancement of the grain size of the semiconductor material 1, by a mechanism that will be explained in more detail below. These point defects or vacancies in the silicon material 1 at the interface 10 are thought to result from non-equilibrium diffusion of silicon atoms into the Si—Al alloy layer 5 during texturing and alloying.

Figure 2:
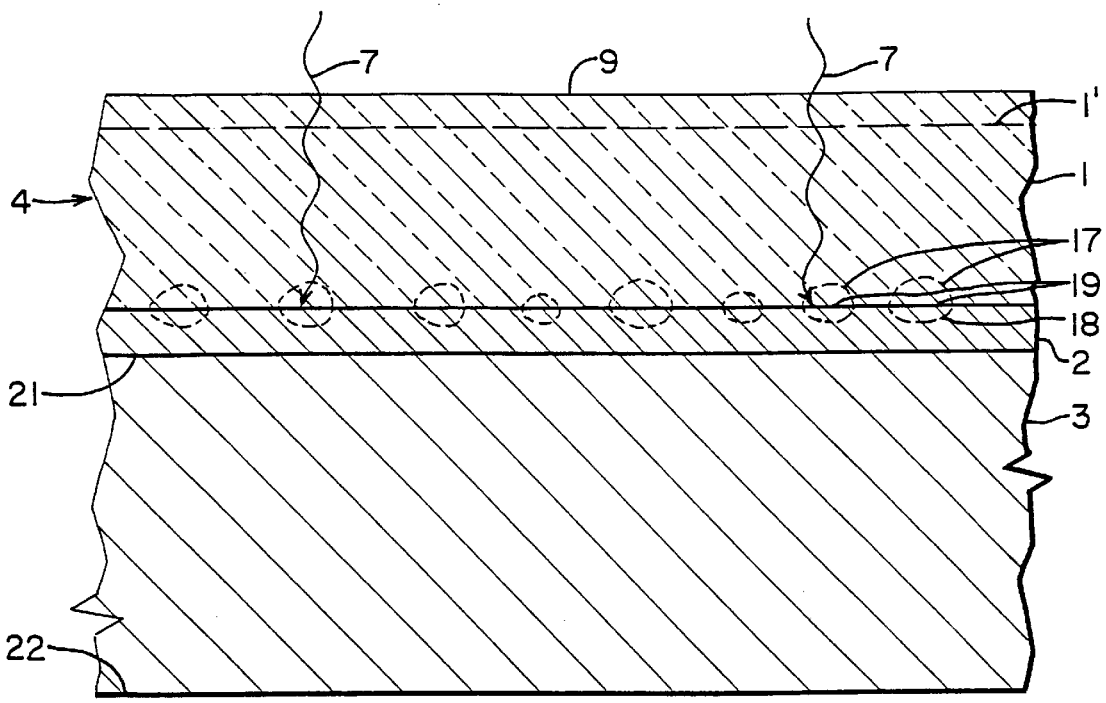
FIG. 2 is an enlarged cross-sectional view of a semiconductor device illustrating the initial nucleation sites or "hot" spots that form as precursors of pits and spikes during processing according to this invention.

Referring now primarily to FIG. 2 in combination with FIG. 6, in the preferred embodiment of the present invention, the energy level of the illuminating electromagnetic radiation 7 is raised at a fairly constant rate for a first time interval between zero (0) and a first time T1 until it reaches a first energy level E1. This initial time interval from zero to T1 is used to initiate silicon diffusion. Although, the incidence of light is accompanied by a rise in temperature of the semiconductor device 4 to some temperature level approaching, but still under, the softening point of the glass substrate 3. The energy level of the illuminating electromagnetic radiation 7 is increased at a slow and uniform rate during this initial time interval to minimize thermal stress on the glass substrate 3, and to extend the life of the tungsten-halogen lamp 8. This first energy level E1 has sufficient energy to produce initial nucleation sites or "hot" spots 19 at the interface 10 to begin to diffuse Si into Al at the interface 10. The normal melting point of aluminum is about 800° C., and the melting point of silicon is about 1,400° C. However, the first energy level E1, while high enough to create a rapid diffusion of silicon in area 18 adjacent the interface 10, as illustrated in FIG. 2, is not high enough or intense enough to melt either the silicon or the aluminum uniformly over the entire area of the interface 10. Instead, the illumination of the semiconductor-metal interface 10, as described above and according to this invention, produces isolated "hot" spots 19 at diverse locations across the interface 10 in an effect, observed by the inventor, in which the semiconductor-metal interface 10 reactions, such as diffusion and melting, are enhanced by the presence of the photons that reach the interface 10. The exact mechanism at the atomic level that produces this enhanced diffusion and melting effect at the interface 10 is not known; however, it is believed that this process occurs within a very short period of time, such as a fraction of a second. Therefore, at this first energy level E1, spots 19 of localized diffusion are formed. This initial diffusion at localized "hot" spots 19 is believed to be more akin to that which occurs in sintering rather than complete melting as required for a normal melted alloy process. Sintering usually occurs at a lower temperature than alloy melting. It is not known what temperatures occur at those precise "hot" spots 19 to produce the diffusion, although temperatures measured on the top surface 9 and bottom layer 10 during this process remain below 450° C. Because both silicon and aluminum conduct heat very rapidly, and since the normal melting temperature of aluminum is 800° C. and silicon is about 1,400° C., the photon effect at the interface 10 possibly causes the enhanced diffusion at the "hot" spots 19, lowers the effective melting temperatures at those spots 19, or both. Once it happens, diffusion of the silicon into the aluminum and vice-versa at those spots 19 occurs very quickly. Further, because the diffusion coefficient of the silicon or other semiconductor material 1 depends on the crystal orientation, the silicon diffuses to produce "pits" 17 bounded by (1-1-1) surfaces, thus sharply defined pyramid shapes.

Figure 3:
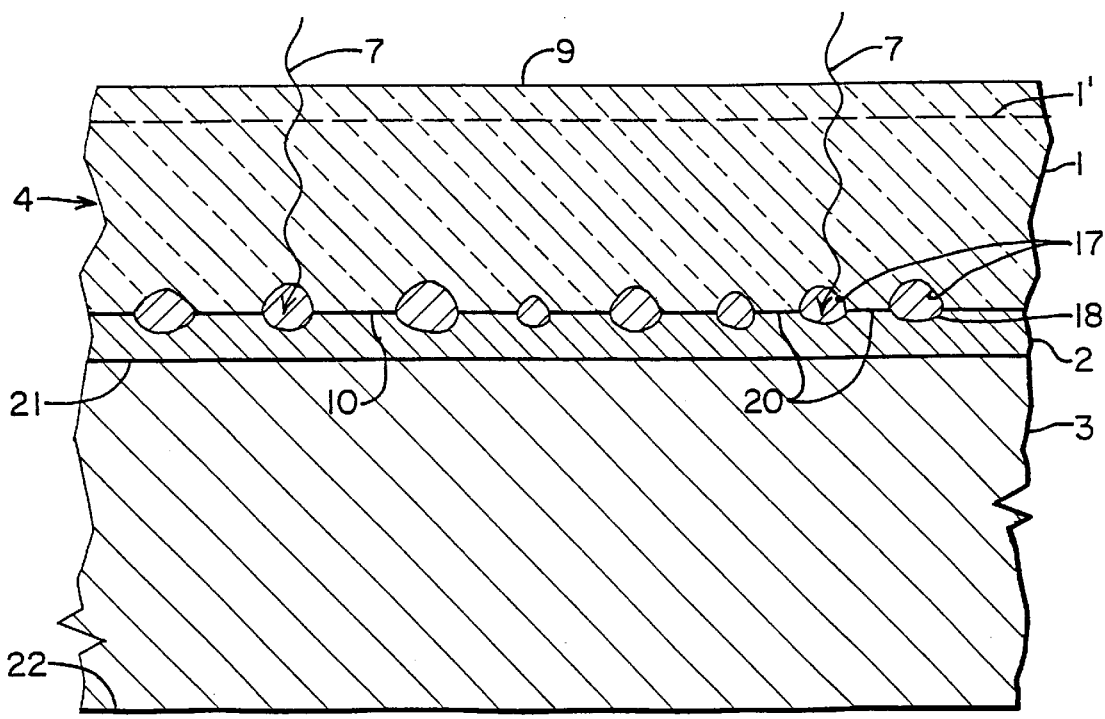
FIG. 3 is an enlarged cross-sectional view similar to FIG. 2, but illustrating the formation of pit and spike texturing according to this invention.

After time T1, the excitation or energy level E1 maintains a sufficient energy to allow the silicon at the local "hot" spots 19 to diffuse into the aluminum and thereby leave the small voids or "pits" in the silicon material 1, as indicated by the broken line peaks 17 in FIG. 2. Those "pits" 17 can then fill with melted aluminum 18 or with a mixture of the melted aluminum and silicon to become "spikes" 17, while the aluminum and the silicon at other areas 20 of the interface 10 remain undiffused and unmelted, and are not mixed with the melted aluminum 18, as illustrated in FIG. 3. Generally, larger values of E1 during this time interval result in a greater density of "pit" 17 formation. Moreover, the longer the time interval between T1 and a second time T2, the larger the "pits" 17 that will be formed. Therefore, the energy level E1 can be adjusted to affect the density of the pits 17 over the interface 10 area, and the second time interval from T1 to T2 can be adjusted to affect the sizes of the pits 17 formed at the interface 10.

Figure 4:
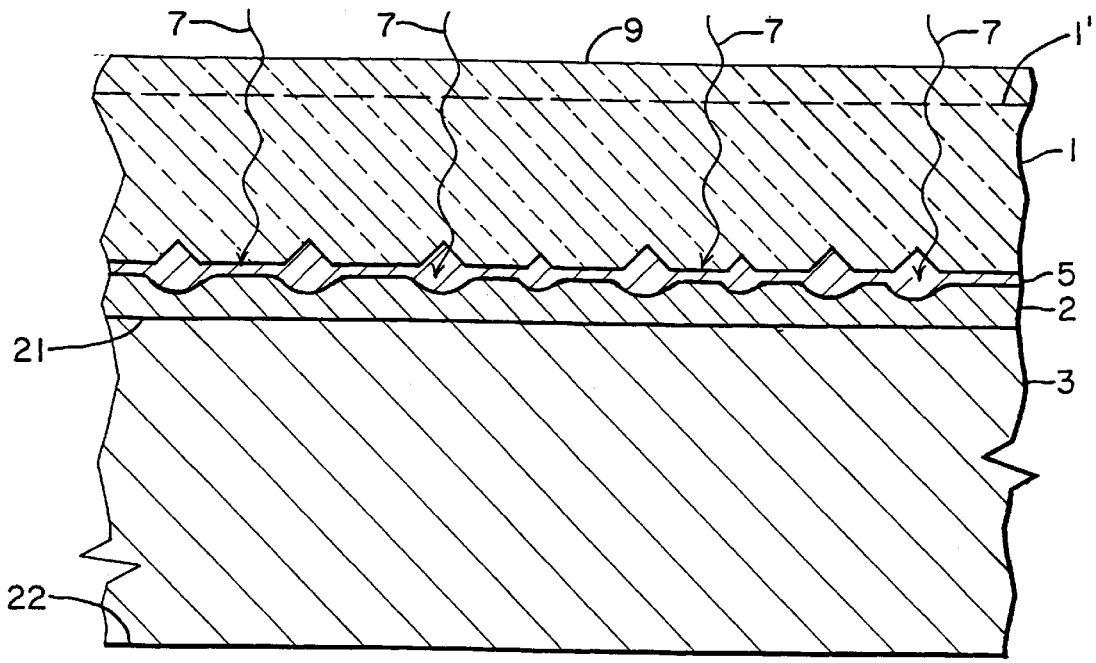
FIG. 4 is an enlarged cross-sectional view similar to FIGS. 2 and 3, but illustrating the advanced stage of alloying across the entire interface area after formation of the pits and spikes texturing.

During the second time interval between T1 and T2, the energy level is uniformly raised at a very rapid rate to a second, higher energy level E2. This step is also accompanied by a rapidly increasing temperature over the entire device, to produce an interfacial melt in a range referenced, according to this invention, as the interface melt regime. During the interface melt regime, a thin layer 5 of aluminum and silicon melts very rapidly in both the diffused spots 17 and the previously unmelted areas 20 between the diffused spots 17, as shown in FIG. 4. The energy level is then held constant at the second energy level E2 during a third time interval between T2 and a third time T3 sufficient to allow alloying of a thin region of silicon and aluminum over the entire interface 10 area to complete the thin Si—Al alloy layer 5 between the silicon material 1 and the metal electrical contact 2, but not so long as to lose the "pits" or "spikes" 17 that provide an effective textured backside surface on the silicon material 1 and not so long as to let the Si—Al alloy layer 5 get too thick to function as an abrupt reflective surface.

It is important that energy level E1 be sufficiently less than energy level E2 to ensure that "pit" 17 initiation occurs before the interface melt regime, without interface melting and alloy formation over the entire area of the interface 10. The time interval between T2 and T3 determines the thickness of the Si—Al alloy interface 5. The longer the time interval, the thicker the Si—Al alloy interface. The thickness of the Si—Al interface 5 can also be increased by increasing the value of E2. The time intervals and the optical power must be controlled so that the interface melts as an alloy. Typically, the total alloying time is less than three minutes. The method described herein results in a highly controlled textured backside on the semiconductor material 1 followed by an epitaxial growth of a highly reflective thin layer 5 of Si—Al alloy between the silicon material 1 and the aluminum layer 2 that has a very low electrical resistivity. The resulting Si—Al alloy is a eutectic composition in that its melting point is lower than the melting point of either of its individual components.

Also during the second and third time intervals, grain formation or enhancement, according to the present invention, begins to occur in the silicon material 1 near the Si—Al alloy layer 5. The exact mechanism at the atomic level is not fully understood, but it is believed that the illumination of the semiconductor-metal interface 10 during these time intervals, as described above and according to this invention, produces "point defects" or "vacancies" in the silicon material 1 as a result of the diffusion of silicon atoms into the melted Si—Al alloy layer 5. Because the rate of diffusion of silicon into aluminum is greater than the rate of diffusion of aluminum into silicon, a non-equilibrium condition is created at the melted Si—Al alloy layer 5, resulting in a net flow of silicon atoms from the silicon material 1 into the Si—Al alloy layer 5. This net flow of atoms into the Si—Al alloy layer 5 creates atomic vacancies or isolated point defects within the silicon layer 1, at sites formerly occupied by the displaced silicon atoms. It is believed that neighboring silicon atoms then move into these vacancies, leaving new vacancies at their former sites. These new vacancies in turn are filled by adjacent silicon atoms, which leave yet further vacancies to be filled. This series of vacancies and successions at the Si—Al alloy layer 5 is thought to cause an unstructured or "non-conservative" movement in the grain boundaries, resulting in enhanced or enlarged grains. It is not known what precise mechanism initiates this phenomenon, but the increase in grain size is thought to be enhanced by the presence of the photons that reach the interface 10. During the fourth time interval between T3 and a fourth time T4, the energy level is lowered from E2 to a third energy level E3 at a fairly uniform, controlled rate to allow crystal growth in the thin Si—Al alloy layer 5, which forms a low electrical resistivity connection between the silicon material 1 and the aluminum contact layer 2.

After time T4, the energy level E3 is held substantially constant during a fifth time interval extending from T4 to a fifth time T5. During the fifth time interval between T4 and T5, the E3 energy level provides a sufficient optical energy level for a sufficient time to facilitate grain enhancement in the semiconductor material 1 in a range referenced, according to this invention, as the "light soaking" or "grain growth" regime. Although the mechanism of grain growth is not yet fully understood, and not wishing to be bound by any specific theory, it is believed that the point defects or vacancies (discussed above), initially generated at the interface 10 during the interface melt regime, continue to diffuse through the silicon material 1, perpetuating the enhancement in grain size. Thus, the illumination of the silicon material 1 during the "light soaking" regime is thought to sustain the movement of point defects, possibly due to the succession of silicon atoms at atomic vacancies, as discussed above. This movement in point defects ultimately effects both the size and orientation of the grains in the silicon layer 1, placing grains in a very low-energy columnar orientation. In other words, grain enhancement or grain growth, in accordance with the method of the present invention, is thought to constitute a solid-phase growth, facilitated by the introduction of point defects. During the light soaking regime, the energy level E3 produces sufficient heat at the interface 10 to maintain a liquid Si—Al alloy layer 5 which readily absorbs silicon interstitials and vacancies in an effect, observed by the inventor, in which the interface 10 reactions are enhanced by the presence of the photons that reach the interface 10. The method of the present invention thus allows movement of the grain boundaries, and hence grain enlargement, at low temperatures (typically between 500 and 550° C.), without exceeding the softening point of the glass substrate 3. In fact, the final grain size of the optically processed semiconductor, according to the present invention, can be orders of magnitude larger than the initial grain size of the deposited material. It is not known what precise mechanism initiates this phenomenon, but the increase in grain size is apparently caused, or at least enhanced, by electromagnetic radiation. Generally, the larger the value of E3 during the fifth time interval, and the longer the time interval between T4 and T5, the greater the enhancement in grain sizes. Therefore, the energy level E3 and time interval from T4 to T5 can be adjusted to affect the final sizes of the grains in the silicon material 1.

Figure 5:
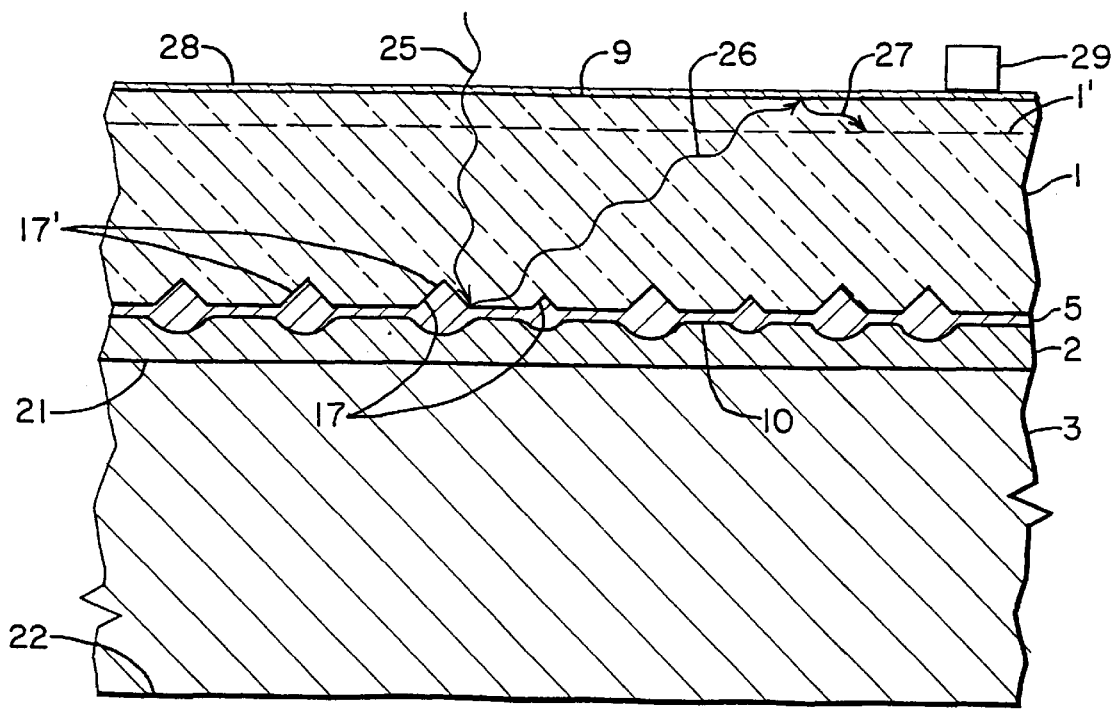
FIG. 5 is an enlarged cross-sectional view of a portion of a semiconductor device illustrating the finished textured and alloyed backside and its light scattering effect.

The finished semiconductor device 4 is shown in FIG. 5 with a plurality of pits 17 in the backside of the semiconductor material 1, which are filled with Si—Al alloy and aluminum in the form of "spikes" 17' which extend upward from the thin Si—Al alloy layer 5 into the semiconductor material 1. Because of the energy and time controls during processing, the Si—Al alloy layer 5 with its spikes 17' are epitaxial crystal structured, but quite abrupt, i.e., not graded extensively into the semiconductor material 1, so that it has a high optical reflectivity. Consequently, during use of the semiconductor device 4 as a photovoltaic cell, for example, any incident light 25 that is not absorbed by the semiconductor material 1 and converted to electricity by the p-n junction will reach the textured backside 10, where it will be reflected by the aluminum contact layer 2 back into the semiconductor material 1 for a second chance at absorption therein. Such reflected light 26 may be scattered by the pits 17 and spikes 17', as shown in FIG. 5, so that its path through the semiconductor material 1 is at an angle, thus longer, to increase the likelihood of absorption. Further, if the radiation 26 is reflected at an angle, as shown in FIG. 5, but still not absorbed, it will strike the surface 9 at an angle, thus enhancing the likelihood of a third or more passes through the semiconductor material 1, as indicated at 27, to further increase chances of absorption. The semiconductor device 4 is shown in FIG. 5 with an antireflective (AR) coating 28 on the front side 9 to enhance the initial transmission of light 25 into the semiconductor material 1, which is known in the art and not a part of this invention. The semiconductor device 4 is also shown in FIG. 5 with a top electrode 29 on the AR coating 28, the function and construction of which is also known in the art and not a part of this invention.

A significant advantage associated with the method of the present invention is that it can yield grain sizes many times the thickness of the semiconductor material 1. Prior to the instant invention, it was thought that the grain size of semiconductor crystals was limited by the temperatures used during deposition, and that the higher the temperature, the larger the grain. Surprisingly, however, the inventor has discovered that the one-sided infrared illumination method of the present invention provides exceptionally large grain sizes, up to ten times the film thickness, using low processing temperatures. Moreover, the rearrangement of grains into a columnar orientation caused by this unique illumination method also results in a mild surface texture, i.e., a rough surface morphology. This roughness, together with a well-designed AR coating 28, will provide low surface reflectance and also facilitate light trapping.

Figure 7A:
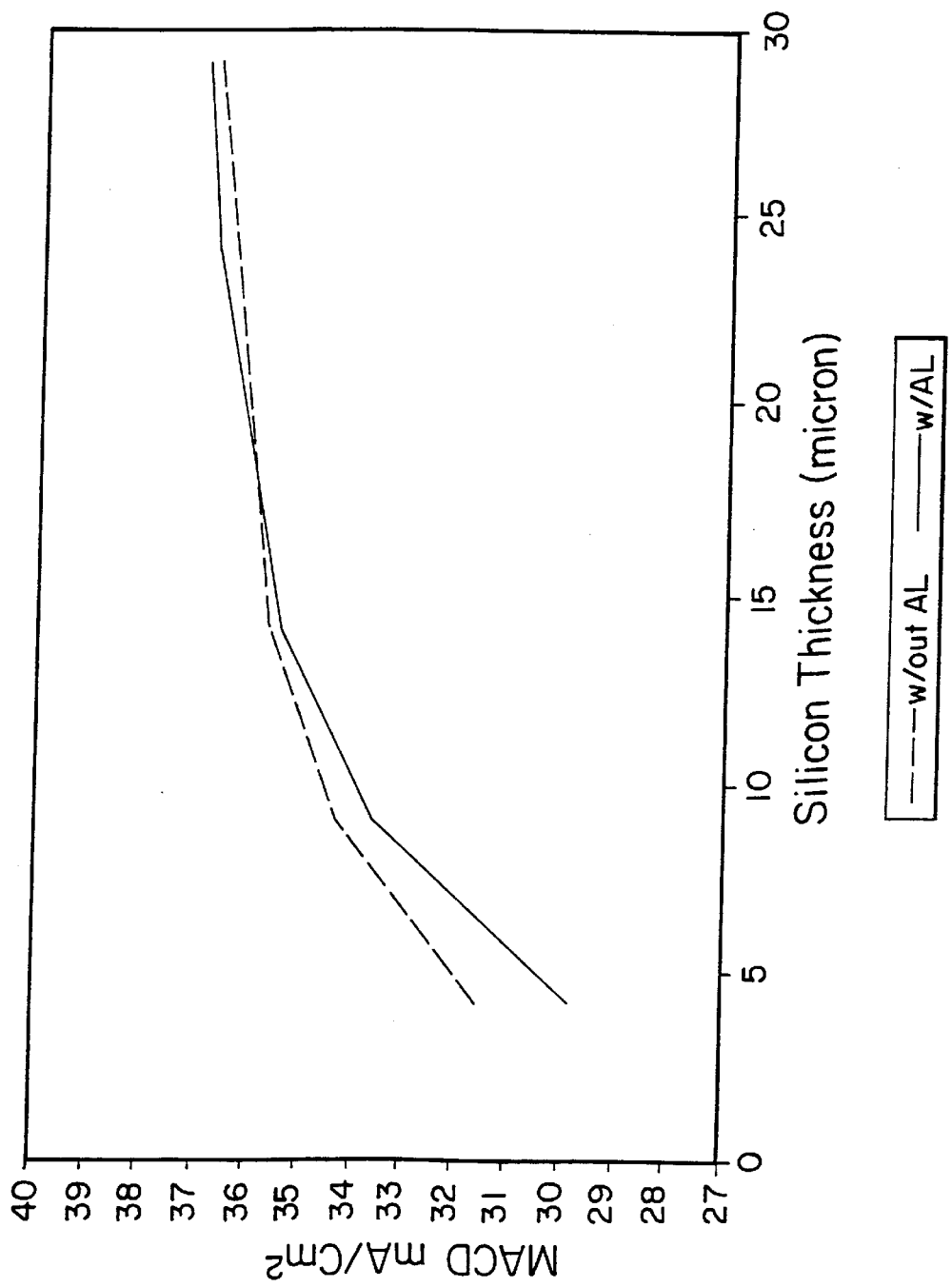
FIG. 7a is a graph of maximum achievable current density (MACD) plotted versus semiconductor film thickness for two device configurations, with and without a metallic contact layer. The front surface of the semiconductor has a pyramidal texture and the back surface is planar.
Figure 7B:
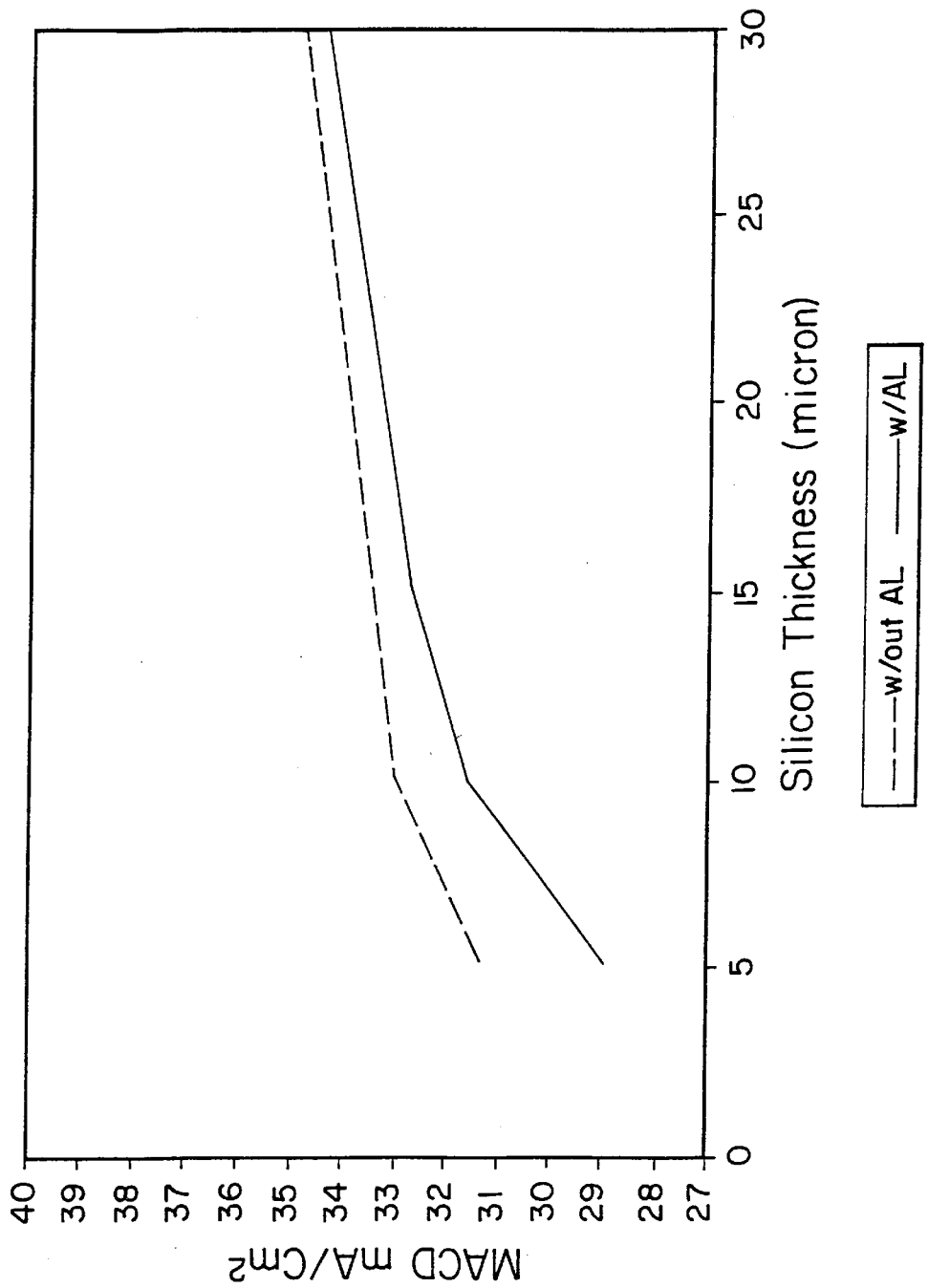
FIG. 7b is a graph of MACD plotted versus film thickness similar to FIG. 7, except that the front surface of the semiconductor is planar and the back surface has a pyramidal texture.
Figure 7C:
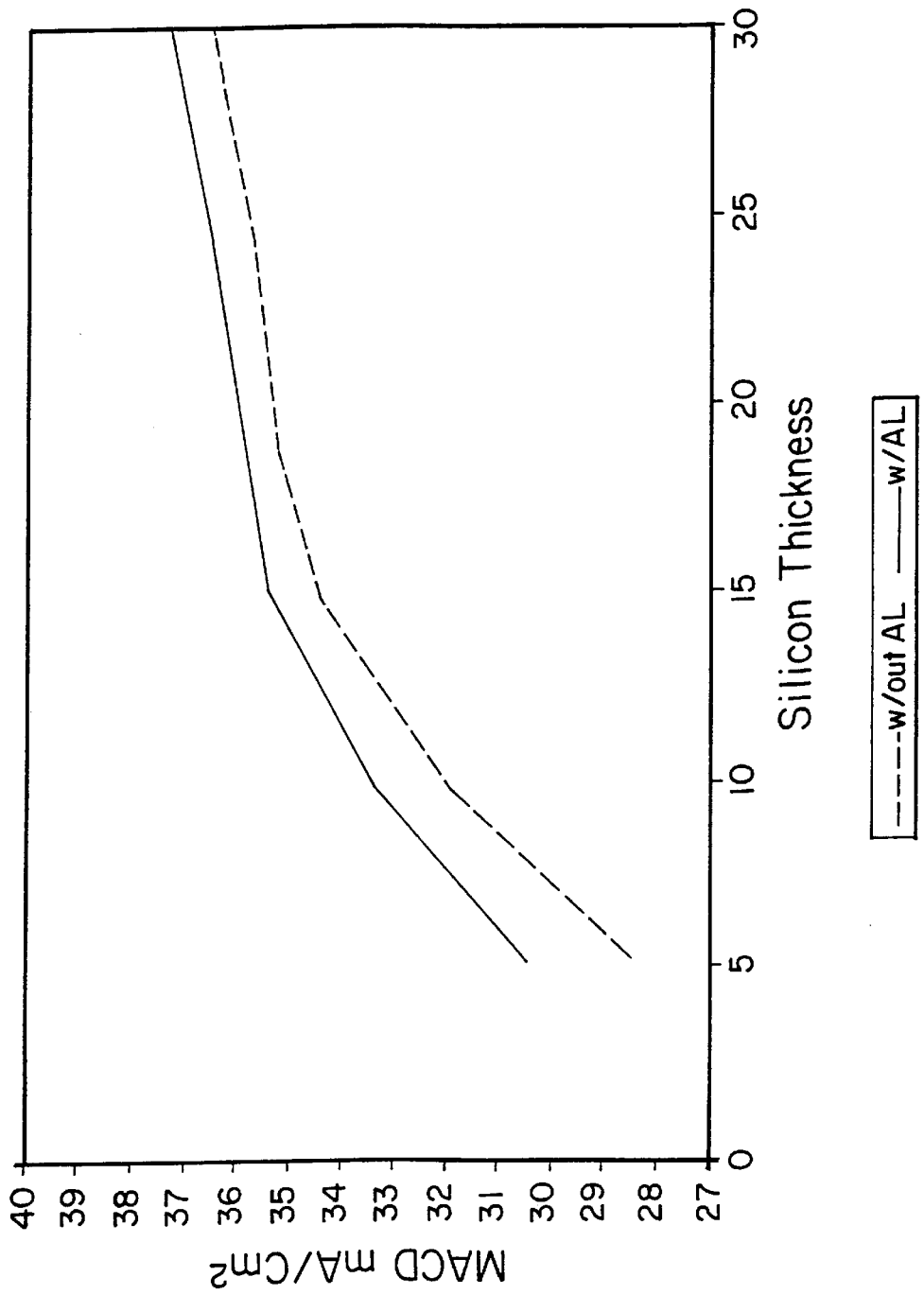
FIG. 7c is a graph of MACD plotted versus film thickness similar to FIGS. 7a and 7b, except that both surfaces of the semiconductor have a pyramidal texture.

Another significant advantage associated with the method of the present invention is that the semiconductor material 1 can be very thin, and yet the semiconductor device 4 exhibits minimal absorption loss due to the metal contact layer 2. Because the thickness of the semiconductor material 1 in thin film devices is much less than the absorption length of incident electromagnetic radiation, multiple passages through the semiconductor layer 1 are required to effectively increase the optical path length and hence absorption of incident radiation by the semiconductor. However, multiple passages requires multiple reflections at the semiconductor-metal interface 10, which typically increases the optical absorption by the metal contact layer 2, resulting in the dissipation of energy as heat. However, the present inventor has discovered that optical absorption loss in the metal layer 2 can be minimized by adjusting the thickness of the semiconductor layer 1. As shown in FIG. 7, very high photovoltaic efficiencies are achieved using a semiconductor layer 1 having a thickness greater than about 15 microns. Photovoltaic efficiencies are further increased by texturing the surfaces of the semiconductor layer 1 in accordance with the present method, also as shown in FIG. 7. The present invention thus provides a very high efficiency, thin film semiconductor device 4, with minimal absorption loss at the metal contact layer 2.

Perhaps the most significant advantage associated with the method of the present invention is the greater number of potential substrates 3 (particularly low-quality, low-cost substrates) made available as a result of the low processing temperatures. Most low-quality substrates (e.g., glass) cannot withstand the high processing temperatures used in conventional fabrication methods. Moreover, low-quality substrates typically include impurities which diffuse into the semiconductor material 1 at these high temperatures. The present invention solves these problems (in part) by using a low-temperature, infrared light illumination process instead of heat.

A yet further significant advantage associated with the method of the present invention is that impurities from the substrate 3 do not reach the semiconductor material 1, either because of the low processing temperature or because the metal contact layer 2 provides an effective impurity barrier between the semiconductor material 1 and the substrate 3, or both. During the interface melt and grain growth regimes, the energy levels E2 and E3 are sufficient to maintain the Si—Al alloy layer 5 in a liquid state, wherein impurities from the substrate 3 are readily absorbed. As previously mentioned, the Si—Al alloy is a eutectic composition in that its melting point is lower than the melting point of either of its individual components, normally melting at about 557° C. Surprisingly, however, the Si—Al alloy layer 5, produced in accordance with the method of the present invention, melts even lower than the conventional eutectic composition, i.e., at approximately 400° C. Although the basis for the observed lowering of the melting point is not fully understood, it is believed that in this unique optical processing method the small particles of the aluminum layer 2 behave like nanoparticles in which it is known that the melting point is depressed due to surface tension related effects. The method of the present invention thus allows the Si—Al interface to melt, and remain melted, at low temperatures (typically below 500° C.), without exceeding the softening point of the glass substrate 3 (approximately 500° C.). Because the glass substrate 3 does not melt at the low processing temperatures of the present method, few impurities diffuse therefrom. However, any impurities which do diffuse from the substrate 3 are effectively absorbed (and trapped) by the melted Si—Al alloy layer 5, which remains in a liquid state throughout the interface melt and grain growth regimes. Once the grain enhancing, texturing and alloying process is complete, the energy level is reduced to zero, thereby reducing the temperature of the semiconductor device 4 and returning the semiconductor components to their solid state, wherein no further diffusion can occur. Generally, the metal contact layer 2 must be thick enough to absorb impurities from the substrate 3, preferably about 1 micron.

The methods of the present invention comprise essentially two or three steps, depending on the embodiment or variation being used, for fabricating high-efficiency, low-cost semiconductor devices. The first embodiment process according to this invention may start with a first stage by depositing a thin layer of metal, preferably between about 1 $\mu$m and 3 $\mu$m, on a substrate 3. Optionally, prior to depositing the metal, a thin layer of chromium may be deposited on the substrate 3 to improve the adhesion of the metal layer thereon. The substrate 3 may be, for example, soda-lime silica glass or amorphous 7059 glass; the metal may be, for example, aluminum, copper, nickel, indium, tin, or cobalt, or other appropriate metal. The deposition of the metal layer may be by any of a variety of common techniques, such as vapor deposition, sputtering, electrolytic precipitation, or the like. Once the metal layer is deposited on the substrate 3, the process can proceed to the second stage in which the semiconductor material 1 is deposited. The semiconductor material 1 may be, for example, amorphous or microcrystalline silicon, germanium, or other appropriate semiconducting crystal. The deposition of the semiconductor material may be by any of a variety of common techniques, such as sputtering, photo- or plasma-enhanced chemical vapor deposition, and low temperature chemical vapor deposition. In this first embodiment, the semiconductor material 1 is deposited as a relatively thick layer, preferably between about 10 $\mu$m and 20 $\mu$m. This composite structure is then processed according to the one-sided infrared light illumination method described above to produce a grain-enhanced, textured and alloyed semiconductor device 4. Although the one-sided infrared light illumination method is preferably carried out as a two-step procedure (as illustrated in FIG. 6 and described hereinabove), which produces a strong bond at the substrate-metal interface and minimizes the potential for disassociation between the components, the steps may be combined for convenience to provide an extended one-step process.

The second embodiment process according to this invention may start with a first stage as above, by depositing a thin layer of metal, preferably between about 1 $\mu$m and 3 $\mu$m, on a substrate 3. In this second embodiment, however, the semiconductor material 1 is deposited as a relatively thin layer, preferably between about 1 $\mu$m and 3 $\mu$m. This composite structure is then processed according to the one-sided infrared light illumination method described above to produce a grain-enhanced composite structure. The grain-enhanced semiconductor material on this composite structure then serves as a seed layer for epitaxial growth during a second deposition step, which may involve the same or a different semiconductor material. For example, a gallium arsenide layer can be epitaxially grown on a grain-enhanced germanium seed layer. Following the second deposition step, the bi-layered semiconductor device can be further optically processed, as described herein. Although the grain enhancement and deposition steps are preferably carried out in separate stages, these steps may be combined for convenience to provide a combination deposition-optical processing technique.

Referring now primarily to FIG. 6, in the preferred embodiment of this invention, when the method is used to process a silicon semiconductor chip with an aluminum electrical contact on the backside, the energy is initially raised at a fairly constant rate of increase from zero to a first energy level E1 in the range of about 2.0 to 3.0 watts per square centimeter ($W/cm^2$) in a first time interval from zero to a first time T1 in the range of about 5 to 20 seconds, preferably about 10 seconds. As discussed above, a higher first energy level E1 will produce a greater "pit" density. If E1 gets too high it could cause immediate uniform melting over the whole interface 10 area thereby producing a texture-free interface.

Once the desired first energy level E1 is reached for the desired "pit" density formation, the energy level is increased at a rapid rate from the first energy level E1 to a second energy level E2 that is in the range of about 5.0 to 8.0 $W/cm^2$ (preferably about 6 $W/cm^2$) to get the thin alloy layer 5 by quickly melting the area 20 between the "pits" 17. This increase of energy from the E1 level to the E2 level can occur in a second time interval of about 5 to 30 seconds in duration (preferably about 15 seconds) extending from T1 to a second time T2.

The E2 energy level is held fairly constant for a third time interval of about 30 to 200 seconds in duration (preferably about 120 seconds) extending from T2 to a third time T3, which is sufficient to achieve good alloying and texture, but not so long as to allow the alloying layer 5 to get too thick or become too graded to reduce the optical reflectance. The energy level is then reduced from E2 to a third energy level E3 in a fourth time interval of about 5 to 10 seconds duration (preferably about 10 seconds) to allow crystal growth in the alloyed layer 5 to ensure low electrical resistivity between the silicon semiconductor material 1 and the aluminum electrical contact 2.

Finally, the E3 energy level is held fairly constant for a fifth time interval of about 200 seconds to about 20 minutes in duration (preferably about 5 minutes) extending from T4 to a fifth time T5, which is sufficient to achieve optimal grain size. The energy level is then reduced from E3 to zero in a sixth time interval of about 60 to 120 seconds duration, preferably about 60 seconds.

As mentioned above, other energy levels and time intervals may be appropriate for processing layers of different thicknesses and other semiconductor and metal contact materials within the scope of this invention.

While the method of this invention results in minimal heating of the atmosphere immediately surrounding the semiconductor device 4, it is preferred, though not required, to perform this alloying method in an inert environment, to eliminate any chance of contamination or oxidation. Such an inert environment could be created by providing the quartz chamber 6 with an inlet port 13 for the inlet of an inert gas, such as argon, and an outlet port 14 for an exit for the processing gas and by providing a means for continually flowing the inert gas through chamber 6 during the one-sided infrared light illumination method according to the present invention.

The foregoing description is considered as illustrative only of the principles of the invention. Furthermore, because numerous modifications and changes will readily occur to those skilled in the art, it is not desired to limit the invention to the exact construction and process shown as described above. Accordingly, resort may be made to all suitable modifications and equivalents that fall within the scope of the invention as defined by the claims which follow.

The embodiments of the invention in which an exclusive property or privilege is claimed are defined as follows:

1. A method for fabricating thin film semiconductor devices, comprising the steps of:

depositing a layer of metal onto a substrate to form a metal-coated substrate;

depositing a layer of semiconductor material onto the metal-coated substrate to form a composite semiconductor structure, wherein the layer of semiconductor material has a first surface and a second surface, and wherein said first surface is a top surface of the composite semiconductor structure and said second surface is a bottom surface adjacent said metal-coated substrate; and illuminating the first surface of the semiconductor material with electromagnetic radiation having a wavelength that is substantially transmitted by the semiconductor material and which is substantially absorbed at the second surface for a time duration and energy level sufficient to alloy the metal-coated substrate with said second surface of the semiconductor material, texture said second surface, and enhance the grain size of said semiconductor material.

2. The method of claim 1, wherein said substrate is a non-crystalline substance.

3. The method of claim 2, wherein said non-crystalline substance is soda-lime silica glass or amorphous glass.

4. The method of claim 1, including the step of depositing said layer of semiconductor material at a temperature in the range of ambient to 600° C.

5. The method of claim 1, wherein said layer of semiconductor material is in the range of about 10 $\mu$m to about 20 $\mu$m.

6. The method of claim 1, wherein said metal is selected from the group consisting of aluminum, copper, nickel, indium, tin, and cobalt.

7. The method of claim 6, wherein said metal is aluminum.

8. The method of claim 1, wherein said metal layer is in the range of about 1 $\mu$m to about 3 $\mu$m.

9. The method of claim 1, including the step of positioning said composite semiconductor structure in an inert environment prior to the steps of illuminating the semiconductor material with electromagnetic radiation.

10. The method of claim 1, wherein said electromagnetic radiation includes wavelengths in the infrared region.

11. The method of claim 1, wherein said illumination is carried out for a time duration and energy level schedule substantially as follows:

increasing the energy level from an initial starting point of zero (0) to a first energy level E1 during an initial time interval from zero (0) to T1;

increasing the energy level at an increased rate from E1 to a second energy level E2 during a second time interval extending from T1 to a second time T2;

maintaining the energy level E2 fairly constant during a third time interval extending from T2 to a third time T3;

decreasing the energy level from E2 to a third energy level E3 during a fourth time interval extending from T3 to a fourth time T4;

maintaining the energy level E3 for a fifth time interval extending from T4 to a fifth time T5; and decreasing the energy level from E3 back to zero (0) during a sixth time interval extending from T5 to a sixth time T6.

12. The method of claim 11, wherein said first energy level E1 is in the range of about 2.0 to 3.0 W/cm$^2$.

13. The method of claim 11, wherein said second energy level E2 is in the range of about 5.0 to 8.0 W/cm$^2$.

14. The method of claim 13, wherein said second energy level E2 is about 6 W/cm$^2$.

15. The method of claim 11, wherein said third energy level E3 is in the range of about 4.0 to 7.0 W/cm$^2$.

16. The method of claim 11, wherein said time T1 is in the range of about 5 to 20 seconds.

17. The method of claim 16, wherein said time T1 is about 10 seconds.

18. The method of claim 11, wherein the time interval from T1 to T2 is in the range of about 5 to 30 seconds.

19. The method of claim 18, wherein the time interval from T1 to T2 is about 15 seconds.

20. The method of claim 11, wherein the time interval from T2 to T3 is in the range of about 30 to 200 seconds.

21. The method of claim 20, wherein the time interval from T2 to T3 is about 120 seconds.

22. The method of claim 11, wherein the time interval from T3 to T4 is about 5 to 10 seconds.

23. The method of claim 11, wherein the time interval from T4 to T5 is about 200 seconds to about 20 minutes.

24. The method of claim 23, wherein the time interval from T4 to T5 is about 5 minutes.

25. The method of claim 11, wherein the energy level is increased from zero to E1 at a fairly constant first rate of increase.

26. The method of claim 25, wherein the energy level is increased from E1 to E2 at a fairly constant second rate of increase that is higher than said first rate of increase.

27. The method of claim 11, wherein the energy level is decreased from E2 to E3 at a fairly uniform rate of decrease.

28. The method of claim 11, wherein said first energy level E1 and said second energy level E2 are sufficient to form local isolated "hot" spots at said interface, and wherein said energy levels E1 and E2 are high enough in energy to melt both the semiconductor material and the metal to form "pits" in the semiconductor material, but insufficient in energy to melt the semiconductor material and metal in a unitary manner over the entire interface area.

29. The method of claim 11, wherein said second energy level E2 is sufficient energy to melt the metal and semiconductor material over the entire interface area quickly enough to avoid melting entirely through the entire thickness of the metal or far enough into the semiconductor material to obliterate said "pits."

30. The method of claim 11, wherein the time interval from T4 to T5 is sufficient to produce a large-grain base region in the semiconductor material.

31. A method for fabricating thin film semiconductor devices, comprising the steps of:

depositing a layer of metal onto a substrate to form a metal-coated substrate;

depositing a first layer of semiconductor material onto the metal-coated substrate to form a first composite semiconductor structure, wherein the first layer of semiconductor material has a first surface and a second surface, and wherein said first surface is a top surface of the first composite semiconductor structure and said second surface is a bottom surface adjacent said metal-coated substrate;

illuminating the first surface of the first layer of semiconductor material with electromagnetic radiation having a wavelength that is substantially transmitted by the first layer of semiconductor material and which is substantially absorbed at the second surface for a time duration and energy level sufficient to enhance the grain size of said first layer of semiconductor material;

depositing a second layer of semiconductor material onto the first composite semiconductor structure to form a second composite semiconductor structure, wherein the second layer of semiconductor material has a first top surface, and wherein said first top surface is a top surface of the second composite semiconductor structure; and illuminating the first top surface of the second layer of semiconductor material with electromagnetic radiation having a wavelength that is substantially transmitted by the semiconductor material and which is substantially absorbed at the second surface of said first layer of semiconductor material for a time duration and energy level sufficient to alloy the metal-coated substrate with said second surface of the semiconductor material, texture said second surface, and enhance the grain size of said second layer of semiconductor material.

32. The method of claim 31, wherein said first layer of semiconductor material is in the range of about 1 $\mu$m to about 3 $\mu$m.

* * * * *